United States Patent
Ying et al.

(10) Patent No.: US 9,583,855 B2
(45) Date of Patent: Feb. 28, 2017

(54) CIRCUIT BOARD DEVICE AND DISPLAY APPARATUS

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Rubo Ying, Beijing (CN); Shounian Chen, Beijing (CN); Jinmoo Park, Beijing (CN)

(73) Assignees: BOE TECHNOLOGY GROUP CO., LTD. (CN); HEFEI BOE OPTOELECTRONICS TECHNOLOGY CO., LTD. (CN)

(*) Notice: Subject to any disclaimer, the term of this patent is extended or adjusted under 35 U.S.C. 154(b) by 0 days.

(21) Appl. No.: 15/134,839

(22) Filed: Apr. 21, 2016

(65) Prior Publication Data
US 2016/0315405 A1 Oct. 27, 2016

(30) Foreign Application Priority Data

Apr. 23, 2015 (CN) .......................... 2015 1 0198344

(51) Int. Cl.
*H01R 12/00* (2006.01)
*H01R 12/71* (2011.01)
(Continued)

(52) U.S. Cl.
CPC ............ *H01R 12/716* (2013.01); *H01R 4/04* (2013.01); *H01R 4/48* (2013.01)

(58) Field of Classification Search
CPC .. H01R 9/0735; H01R 9/0742; H01R 23/668; H01R 23/662
(Continued)

(56) References Cited

U.S. PATENT DOCUMENTS

2014/0141628 A1* 5/2014 Hsu .................... H01R 12/7082
439/67
2014/0148021 A1* 5/2014 Hsu ....................... H01R 12/79
439/67
(Continued)

FOREIGN PATENT DOCUMENTS

CN 101917822 A 12/2010
CN 102006732 A 4/2011
(Continued)

OTHER PUBLICATIONS

Office Action in Chinese Patent Application No. 201510198344.2, dated Sep. 5, 2016.

*Primary Examiner* — Phuongchi T Nguyen
(74) *Attorney, Agent, or Firm* — Bakerhostetler LLP

(57) ABSTRACT

A circuit board device is provided, including: a first circuit board having a first predetermined connection section; a second circuit board arranged opposite to the first circuit board and having a second predetermined connection section directly facing the first predetermined connection section; and a connector including a first portion and a second portion. The connecter has: a first state where the first portion is arranged at a side of the first circuit board away from the second circuit board, the second portion is arranged at a side of the second circuit board away from the first circuit board, and the first portion and the second portion cooperate with each other to press the first circuit board against the second circuit board; and a second state where the first circuit board is separated from the second circuit board.

17 Claims, 6 Drawing Sheets

(51) Int. Cl.
*H01R 4/48* (2006.01)
*H01R 4/04* (2006.01)

(58) Field of Classification Search
USPC .................................... 439/67, 77, 492–499
See application file for complete search history.

(56) References Cited

U.S. PATENT DOCUMENTS

2015/0200473 A1* 7/2015 Chiang .................. H01R 12/79
 439/67
2016/0181715 A1* 6/2016 Schrader .............. H01R 12/772
 439/67

FOREIGN PATENT DOCUMENTS

| | | |
|---|---|---|
| CN | 102386205 A | 3/2012 |
| DE | 20 2006 012 515 U1 | 11/2006 |
| JP | 2001-313106 A | 11/2001 |

\* cited by examiner

CIRCUIT BOARD DEVICE AND DISPLAY APPARATUS

CROSS-REFERENCE TO RELATED APPLICATION

The present application claims a priority to the Chinese patent application No. 201510198344.2 filed on Apr. 23, 2015, which is incorporated herein by reference in its entirety.

TECHNICAL FIELD

The present disclosure relates to the field of display technology, in particular to a circuit board device and a display apparatus.

BACKGROUND

Currently, a thin film transistor liquid crystal display (TFT-LCD) has become a mainstream product in flat-panel display apparatuses due to its advantages such as small volume, low power consumption and being free of radiation, and it has been applied to various fields, such as liquid crystal televisions, computers, mobile phones and personal digital assistances (PDAs).

Usually, the TFT-LCD mainly includes a liquid crystal display panel and a backlight module. A flexible circuit board or printed circuit board is arranged on the display panel for driving a circuit on the display panel. The backlight module usually uses a light-emitting diode (LED) light strip as a backlight source. A flexible circuit board for driving the LED light strip is fixed to the flexible circuit board or printed circuit board on the display panel, and they are electrically connected to each other at predetermined positions (predetermined connecting fingers).

SUMMARY

The present disclosure provides a circuit board device, and a display apparatus, so as to prevent a soldering process and a desoldering process for the flexible circuit board for the LED strip and the flexible circuit board or printed circuit board on the display panel at a high temperature, and facilitate the reworking process.

In one aspect, the present disclosure provides in some embodiments a circuit board device, including: a first circuit board having a first predetermined connection section; a second circuit board arranged opposite to the first circuit board and having a second predetermined connection section directly facing the first predetermined connection section; and a connector including a first portion and a second portion. The connecter has: a first state where the first portion is arranged at a side of the first circuit board away from the second circuit board, the second portion is arranged at a side of the second circuit board away from the first circuit board, and the first portion and the second portion cooperate with each other to press the first circuit board against the second circuit board so that the first predetermined connection section abuts against the second predetermined connection section and the first circuit board is electrically connected to the second circuit board; and a second state where the first circuit board is separated from the second circuit board so as to separate the first predetermined connection section from the second predetermined connection section and electrically disconnect the first circuit board from the second circuit board.

Optionally, the first circuit board is provided with multiple first alignment holes, the second circuit board is provided with multiple second alignment holes at positions corresponding to the multiple first alignment holes, and the first portion and/or the second portion are provided with protrusions which are fitted into the first alignment holes and the second alignment holes in the first state.

Optionally, the connector is a clip-like structure, and the first portion is connected to one side of the second portion. The first portion and the second portion are rotatable about a connection position to move close to each other, so as to be in the first state, thereby pressing the first circuit board against the second circuit board through the first portion and the second portion. The first portion and the second portion are rotatable about the connection position to move away from each other, so as to be in the second state, thereby separating the first circuit board from the second circuit board.

Optionally, the connector is an elastic sheet clip, and the first portion and the second portion are connected to each other to form an integral structure.

Optionally, the connector is a metallic elastic sheet clip.

Optionally, each of the first portion and the second portion is an adhesive sheet having an adhesive force, in the first state, the first portion and the second portion are adhered onto the first circuit board and the second circuit board respectively, and the first portion is connected to the second portion in a tensioning manner, so as to press the first circuit board against the second circuit board. In the second state, the first portion is removed from the first circuit board and/or the second portion is removed from the second circuit board, so as to separate the first circuit board from the second circuit board.

Optionally, the connector is adhesive tape.

Optionally, the first predetermined connection section is a predetermined connecting finger including multiple first terminals. The second predetermined connection section is a second predetermined connecting finger including multiple second terminals at positions corresponding to the multiple first terminals. A conductive sheet is arranged between, and has a shape fit to the first predetermined connection section and the second predetermined connection section, so as to electrically connect the first terminals of the first predetermined connection section to the corresponding second terminals of the second predetermined connection section.

Optionally, the conductive sheet is a conductive, double-sided adhesive tape.

Optionally, the conductive sheet is an anisotropic conductive, double-sided adhesive tape which is conductive in a longitudinal direction and nonconductive in a horizontal direction.

Optionally, a number of the first alignment holes is three, the three first alignment holes are arranged as vertexes of a triangle, and the second alignment holes and the protrusions are arranged at positions corresponding to the three first alignment holes.

Optionally, the protrusions are arranged on the first portion or the second portion, and are fitted into the first alignment holes and the second alignment holes in the first state.

Optionally, the protrusions are arranged on both the first portion and the second portion. In the first state, the protrusions on the first portion are fitted into the first alignment holes in the first circuit board, and the protrusions on the second portion are fitted into the second alignment holes in the second circuit board.

In another aspect, the present disclosure provides in some embodiments a display apparatus, including the above-mentioned circuit board device. The first circuit board is a flexible circuit board or printed circuit board on a display panel of the display apparatus, and the second circuit board is a flexible circuit board for an LED light strip of a backlight module of the display apparatus.

With the circuit board device in the embodiments of the present disclosure, through the first portion and second portion of the connector, the two circuit boards may be pressed against each other or separated from each other, and electrical connection between the two circuit boards can be established or interrupted, without any soldering or desoldering process at a high temperature, so it is able to reduce the risk. As compared with the related technologies where the circuit boards are connected to each other through a connection member, the connector in the embodiments of the present disclosure is simple and cheap, and may be operated conveniently without any soldering or press-fit process, so as to facilitate the operation and the reworking process.

DETAILED DESCRIPTION OF THE EMBODIMENTS

For a display apparatus in related technologies, a predetermined portion of the flexible circuit board for the LED light strip of the backlight source may be connected to a predetermined portion of the flexible circuit board or printed circuit board on the liquid crystal display panel in the following two ways.

Figure 1:
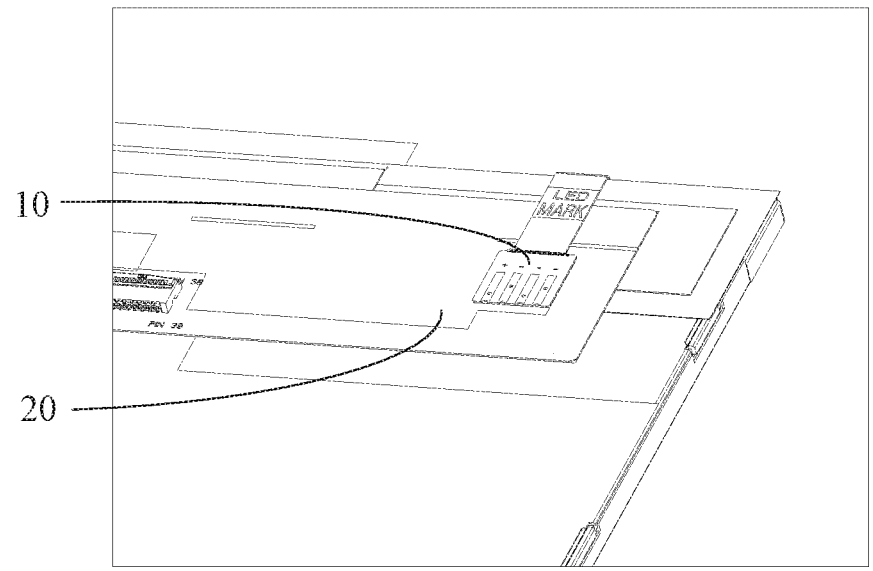
FIG. 1 is a schematic view showing a first connection mode where a flexible circuit board or printed circuit board on a display panel is connected to a flexible circuit board for an LED light strip of a backlight source in a display apparatus in related technologies.

In one way, as shown in FIG. 1, a predetermined portion of the flexible circuit board 10 for the LED light strip of the backlight source may be soldered to a predetermined portion of the flexible circuit board or printed circuit board 20 on the liquid crystal display panel, so as to fix the two circuit boards and electrically connect them to each other at a low production cost. However, a soldering process needs to be performed at a high temperature, so it is complex and sometimes may cause a risk. In addition, during the manufacture of a display apparatus, it is usually required to test the performance of the display apparatus many times, reworking is required, and accordingly, the flexible circuit board for the LED light strip of the backlight source needs to be desoldered from the flexible circuit board or printed circuit board on the liquid crystal display panel at a high temperature.

Figure 2:
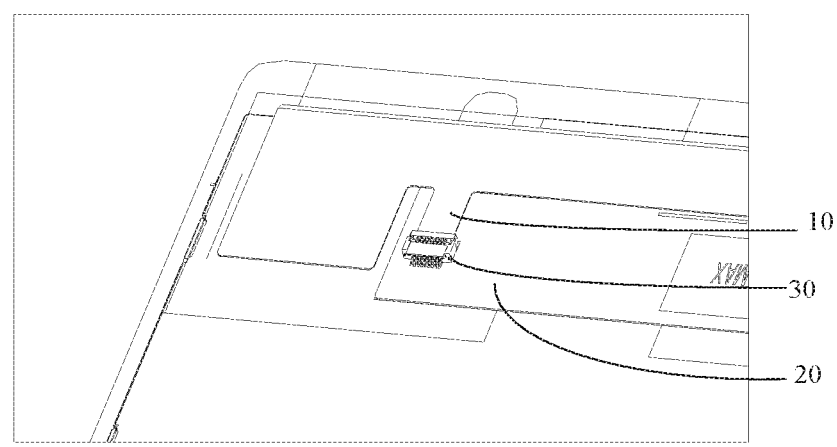
FIG. 2 is another schematic view showing a second connection mode where a flexible circuit board or printed circuit board on a display panel is connected to a flexible circuit board for an LED light strip of a backlight source in a display apparatus in related technologies.

In another way, as shown in FIG. 2, a predetermined portion of the flexible circuit board 10 for the LED light strip of the backlight source may be connected to a predetermined portion of the flexible circuit board or printed circuit board 20 on the liquid crystal display panel through a specific connector 30. To be specific, the connector 30 is soldered onto the predetermined portion of the flexible circuit board or printed circuit board 20, and it is provided with multiple wire terminals. The flexible circuit board 10 for the LED light strip is connected to wires on the connecter 30 and is fixed to the connector 30 in a plug-fit manner. However, the connector is expensive. In addition, during the manufacture, the connector 30 needs to be plugged and extracted repeatedly, so it may be easily damaged and a reworking process may be adversely affected.

The present disclosure will be described hereinafter in conjunction with the drawings and embodiments. The following embodiments are for illustrative purposes only, but shall not be used to limit the scope of the present disclosure.

In a display apparatus in the related technologies, a flexible circuit board or printed circuit board on a display panel is fixed and connected to a flexible circuit board for an LED light strip of a backlight source through soldering or plug-fit, so the circuit boards may easily be damaged, and the operation and reworking process may be adversely affected. The present disclosure provides a circuit board device with a simple structure. Because no soldering or plug-fit process is required, it is able to facilitate the operation and the reworking process.

As shown in FIGS. 3 to 8, the circuit board device provided in the present disclosure includes a first circuit board 100, a second circuit board 200 and a connector 300. The first circuit board 100 has a first predetermined connection section. The second circuit board 200 is arranged opposite to the first circuit board 100 and has a second predetermined connection section directly facing the first predetermined connection section.

The connector 300 includes a first portion 301 and a second portion 302. The connector 300 has a first state and a second state. In the first state, the first portion 301 is arranged at a side of the first circuit board 100 away from the second circuit board 200, the second portion 302 is arranged at a side of the second circuit board 200 away from the first circuit board 100, and the first portion 301 and the second portion 302 cooperate with each other to press the first circuit board 100 against the second circuit board 200 so that the first predetermined connection section abuts against the second predetermined connection section and the first circuit board 100 is electrically connected to the second circuit board 200. In the second state, the first circuit board 100 is separated from the second circuit board 200 so as to separate the first predetermined connection section from the second predetermined connection section and interrupt the electrical connection between the first circuit board 100 and its the second circuit board 200.

According to the circuit board device in the embodiments of the present disclosure, through the connector 300 with a simple structure, it is able to clamp the first circuit board 100 and the second circuit board 200 between the first portion 301 and the second portion 302, and meanwhile enable the first predetermined connection section of the first circuit board 100 to abut against the second predetermined connection section of the second circuit board 200, thereby electrically connecting the first circuit board 100 to the second circuit board 200. In the case that the first circuit board 100 needs to be separated from the second circuit board 200, the connector 300 may be changed from the first state to the second state, and at this time, the electrical connection between the first circuit board 100 and the second circuit board 200 may be interrupted due to the separation of the first predetermined connection section from the second predetermined connection section. As compared with the related technologies where a soldering process at a high temperature is adopted, no soldering or desoldering process at high temperature is required in the embodiments of the present disclosure, so there is no risk caused by the soldering process, and the operation may be performed conveniently. In addition, as compared with the related technologies where the two circuit boards are connected to each other via a connection member, the connector 300 in the embodiments of the present disclosure is simple and cheap, and may be operated conveniently without any soldering or plug-fit process, so as to facilitate the operation and the reworking process.

It should be appreciated that, the circuit board device in the embodiments of the present disclosure may be applied to a display apparatus to connect a flexible circuit board or printed circuit board on a display panel of the display apparatus to a flexible circuit board for an LED light strip of a backlight source of the display apparatus. In other words, the first circuit board 100 may be the flexible circuit board or printed circuit board on the display panel, and the second circuit board 200 may be the flexible circuit board for the LED light strip of the backlight source. Of course, it should be appreciated that, in addition to the display apparatus, the circuit board device in the embodiments of the present disclosure may alternatively be used to fix and electrically connect two circuit boards in any other product.

For ease of understanding, the present disclosure will be described hereinafter by taking the situation where the circuit board device is used to connect the flexible circuit board or printed circuit board on the display panel of the display apparatus to the flexible circuit board for the LED light strip of the backlight source of the display apparatus as an example.

Optionally according to some embodiments of the present disclosure, as shown in FIGS. 4-5 and FIGS. 7-8, the first circuit board 100 may be provided with multiple first alignment holes 101, the second circuit board 200 may be provided with multiple second alignment holes 201 at positions corresponding to the multiple first alignment holes 101. The first portion 301 and/or the second portion 302 may be provided with protrusions 303 capable of being fitted into the first alignment holes 101 and the second alignment holes 201 when the connector 300 is in the first state.

Through the alignment holes in the first circuit board 100 and the second circuit board 200 as well as the protrusions 303 arranged on the first portion 301 and/or the second portion 302 at positions corresponding to the alignment holes, in the case that the first circuit board 100 is to be connected to the second circuit board 200, the alignment holes in the first circuit board 100 are aligned with the alignment holes in the second circuit board 200 at first, and then the protrusions 303 on the first portion 301 and/or the second portion 302 are fitted into the corresponding alignment holes, the first circuit board 100 is pressed against the second circuit board 200 through the first portion 301 and the second portion 302, thereby connecting the first circuit board 100 to the second circuit board 200. With the arrangement of the alignment holes and the protrusions 303, it is able to fix the first circuit board 100 to the second circuit board 200 better, facilitate the alignment and prevent the circuit boards from being offset relative to each other. In addition, for the flexible circuit board or printed circuit board, it is easy to provide the circuit board with the alignment holes and the protrusions 303, which are used for stable fixation and accurate alignment.

Optionally according to some embodiments of the present disclosure, as shown in FIGS. 4-5 and FIGS. 7-8, each the first portion 301 and the second portion 302 of the connector 300 is provided with protrusions 303. In the first state, the protrusions 303 on the first portion 301 are fitted into the first alignment holes 101 in the first circuit board 100 respectively, and the protrusions 303 on the second portion 302 are fitted into the second alignment holes 201 in the second circuit board 200 respectively.

As stated in the above technical solution where the protrusions 303 are arranged on both the first portion 301 and the second portion 302, in the case that the first portion 301 and the second portion 302 are each of a sheet-like structure, especially a metallic sheet, the protrusion 303 may be of a relatively small height, so as to facilitate the formation thereof by punching. Of course, it should be appreciated that, during the actual application, the protrusions 303 may alternatively be merely arranged on the first portion 301 or the second portion 302 of the connector 300. In the case that the protrusions 303 are merely arranged on the first portion 301 or the second portion 302, the protrusions 303 may each be of a relatively large height, so as to be fitted into the first alignment holes 101 in the first circuit board 100 and the second alignment holes 201 in the second circuit board 200.

Optionally according to some embodiments of the present disclosure, as shown in FIGS. 3-4 and FIGS. 6-7, in the first state, the first portion 301 is arranged at a position where the first predetermined connection section of the first circuit board 100 is located, and the second portion 302 is arranged at a position where the second predetermined connection section of the second circuit board 200 is located. In other words, the first portion 301 and the second portion 302 of the connector 300 may directly press against the first predetermined connection section and the second predetermined connection section respectively, so as to enable the first predetermined connection section to abut against the second predetermined connection section accurately. At this time, the first alignment holes 101 may be arranged in the first predetermined connection section, and the second alignment holes 201 may be arranged in the second predetermined connection section.

Figure 4:
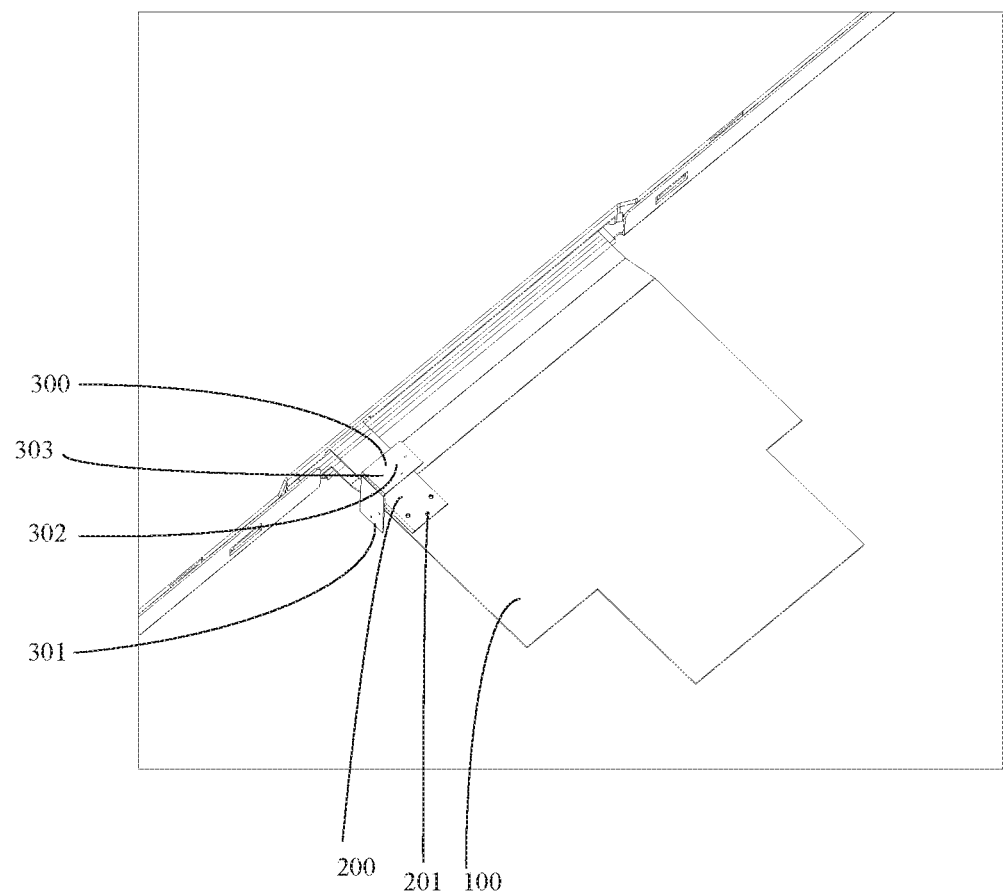
FIG. 4 is a schematic view showing the circuit board device in FIG. 3 in a second state.

As shown in FIG. 4, optionally, there are three first alignment holes 101, and they are arranged as vertexes of a triangle. The second alignment holes 201 and the protrusions 303 are arranged at positions corresponding to the first alignment holes 101. In this way, it is able to improve the alignment and facilitate the assembling. Of course, it should be appreciated that, during the actual application, the positions of the alignment holes and protrusions 303 and the distribution thereof are not limited thereto, and they may be adjusted in accordance with the practical need.

In addition, in a display apparatus in related technologies, the predetermined connection section of the flexible circuit board or printed circuit board on the display panel and the predetermined connection section of the flexible circuit board for the LED light strip of the backlight source are both predetermined connecting fingers. In embodiments of the present disclosure, optionally, the first predetermined connection section is a first predetermined connecting finger and the second predetermined connection section is a second predetermined connecting finger, the first predetermined connecting finger is provided with multiple first terminals and the second predetermined connecting finger is provided with multiple second terminals at positions corresponding to the first terminals. Each first alignment hole 101 is arranged between two adjacent first terminals, and each second alignment hole 201 is arranged between two adjacent second terminals, so as to prevent adverse affection on the electrical connection between the two circuit boards.

Figure 7:
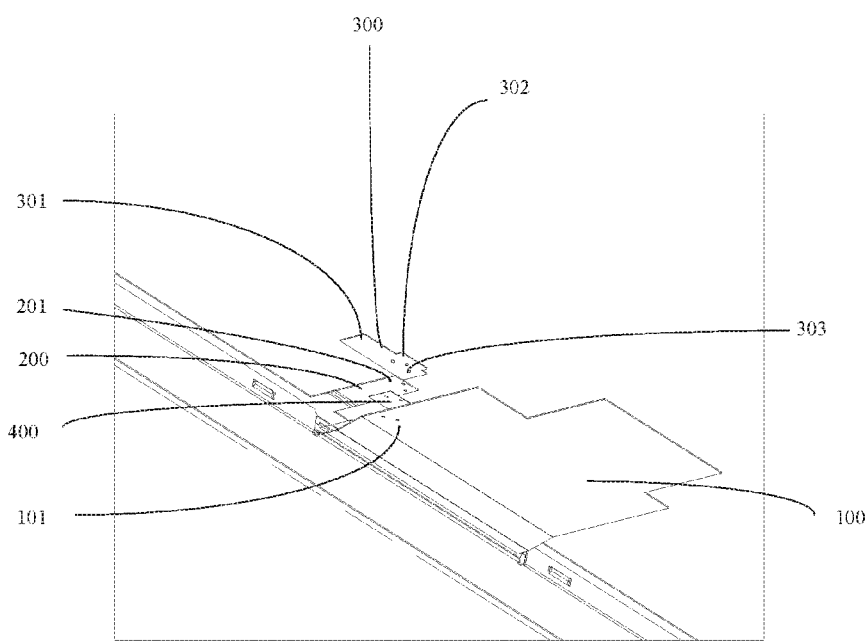
FIG. 7 is a schematic view showing the circuit board device in FIG. 6 in a second state.
Figure 8:
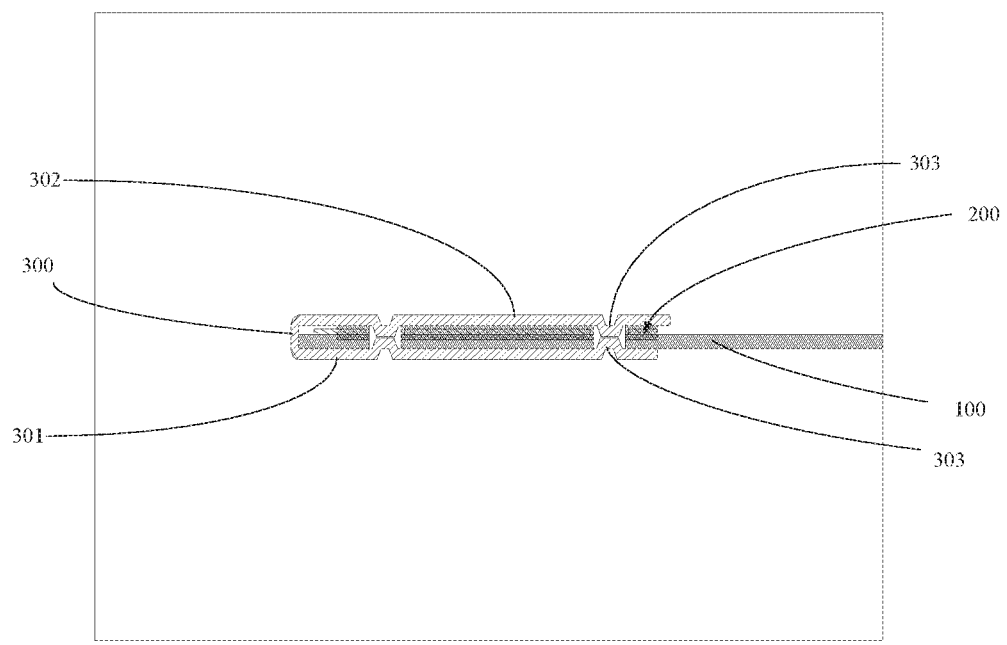
FIG. 8 is a sectional view of the circuit board device in FIG. 3.

Optionally according to some embodiments of the present disclosure, as shown in FIG. 7, a conductive sheet 400 may be arranged between the first predetermined connection section and the second predetermined connection section. The conductive sheet 400 has a shape fit to the first predetermined connection section and the second predetermined connection section, so as to electrically connect the first terminals of the first predetermined connection section to the corresponding second terminals of the second predetermined connection section.

By arranging the conductive sheet 400 between the first predetermined connection section and the second predetermined connection section, it is able to prevent the occurrence of imperfect contact between the first predetermined connection section and the second predetermined connection section. In addition, since the conductive sheet 400 has a shape fit to the first predetermined connection section and the second predetermined connection section, it is able to ensure the electrical connection between the first terminals of the first predetermined connection section and the corresponding second terminals of the second predetermined connection section.

Optionally according to some embodiments of the present disclosure, the conductive sheet 400 is a conductive, double-sided adhesive tape. To connect the first circuit board 100 to the second circuit board 200, two surfaces of the conductive sheet 400 are adhered onto the first predetermined connecting finger and the second predetermined connecting finger respectively. Hence, the conductive sheet 400 is of a simple structure and may be operated conveniently. In addition, it is able to further ensure reliable connection through adhesion.

Further optionally, the conductive sheet 400 is an anisotropic conductive, double-sided adhesive tape which is conductive in a longitudinal direction and nonconductive in a horizontal direction. In this way, it is able to prevent adjacent first terminals of the first predetermined connecting finger from being electrically connected to each other, prevent adjacent second terminals of the second predetermined connecting finger from being electrically connected to each other, and allow the first terminals of the first predetermined connecting finger to be electrically connected to the corresponding second terminals of the second predetermined connecting finger.

Of course, it should be appreciated that, the conductive sheet 400 may alternatively be of another structure. For example, the conductive sheet 400 may be a metallic sheet having a shape fit to the first predetermined connecting finger and the second predetermined connecting finger.

The connector 300 of the circuit board device will be described hereinafter in conjunction with preferred embodiments.

According to some embodiments of the present disclosure, as shown in FIGS. 3-5 and 8, the connector 300 is a clip-like structure, and one side of the first portion 301 is connected to one side of the second portion 302. The first portion 301 and the second portion 302 are capable of rotating about a connection position to move close to each other, so as to be in the first state, thereby pressing the first circuit board 100 against the second circuit board 200 through a clamp force caused by the first portion 301 and the second portion 302. The first portion 301 and the second portion 302 are capable of rotating about the connection position to move away from each other, so as to be in the second state, thereby releasing the clamp force caused by the first portion 301 and the second portion 302 and separating the first circuit board 100 from the second circuit board 200.

In the circuit board device according to the embodiments, the first portion 301 and the second portion 302 of the clip-like connector 300 may each be a sheet, and may be move close to, and away from, each other. In the case that the two circuit boards are to be connected to each other, forces may be applied to the first portion 301 and the second portion 302, so as to gradually move the first portion 301 and the second portion 302 close to each other, thereby pressing the first circuit board 100 against the second circuit board 200. In the case that the circuit boards are to be separated from each other, forces in opposite directions to the forces applied in the previous case may be applied to the first portion 301 and the second portion 302, so as to gradually move the first portion 301 away from the second portion 302, thereby separating the first circuit board 100 from the second circuit board 200.

Figure 3:
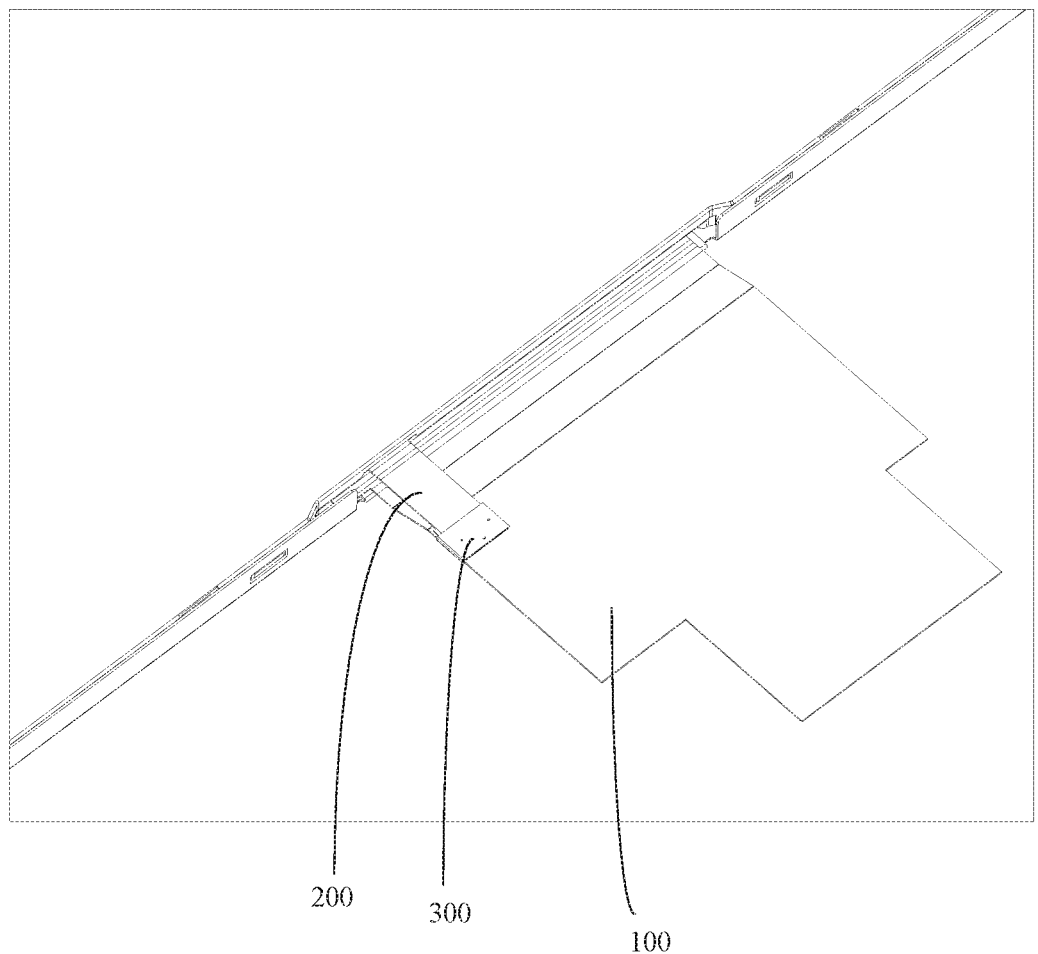
FIG. 3 is a schematic view showing a circuit board device in a first state according to some embodiments of the present disclosure.
Figure 5:
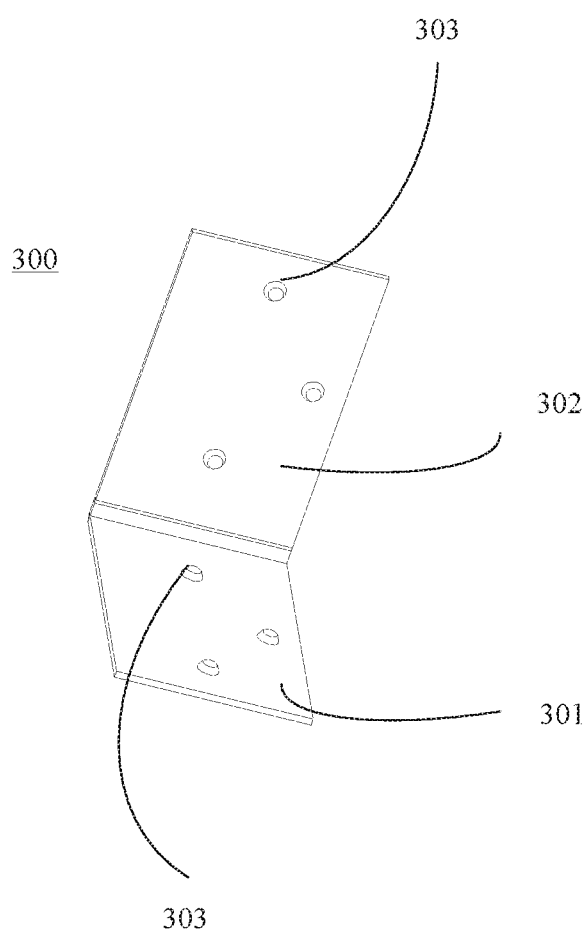
FIG. 5 is a schematic view showing a connector according to some embodiments of the present disclosure.

Optionally in the embodiments, as shown in FIGS. 3-5, the connector 300 is an elastic sheet clip. The first portion 301 and the second portion 302 are both sheet-like and connected to each other to form an integral structure. It should be appreciated that, in some other embodiments of the present disclosure, the connector 300 may be of other clip structure. For example, the first portion 301 may be connected to one side of the second portion 302 via a shaft, and an elastic member may be arranged between, and abut against, the first portion 301 and the second portion 302. In the first state, the first portion 301 and the second portion 302 may rotate about the shaft to move close to each other and may apply a clamp force via the elastic member so as to press the first circuit board 100 against the second circuit board 200. In the second state, a force may be applied to the first portion 301 and the second portion 302, so as to enable them to rotate about the shaft to move away from each other, thereby separating the first circuit board 100 from the second circuit board 200.

Further optionally, the connector 300 is a metallic elastic sheet clip, which has better fixation effect and longer service life.

Further optionally, as shown in FIGS. 3-5, the metallic elastic sheet clip may be formed by a metallic sheet which may be kept in a fixed shape after being curved. In the case that the two circuit boards are to be connected to each other, forces may be applied to the metallic sheet, so that the metallic sheet is curved into the first portion 301 and the second portion 302 and maintained in a fixed shape, hereby pressing the first circuit board 100 against the second circuit board 200. In the case that the first circuit board 100 is to be separated from the second circuit board 200, forces in opposite direction to the forces applied in the previous case may be applied to the first portion 301 and the second portion 302, so as to enable the first portion 301 and the second portion 302 to be restored to and fixed in its original shape, its thereby separating the first circuit board 100 from the second circuit board 200.

It should be appreciated that, in the embodiments of the present disclosure, in the case that the connector 300 is a metallic elastic sheet clip, the protrusions 303 on the first portion 301 and/or the second portion 302 may be formed integrally by punching.

Figure 6:
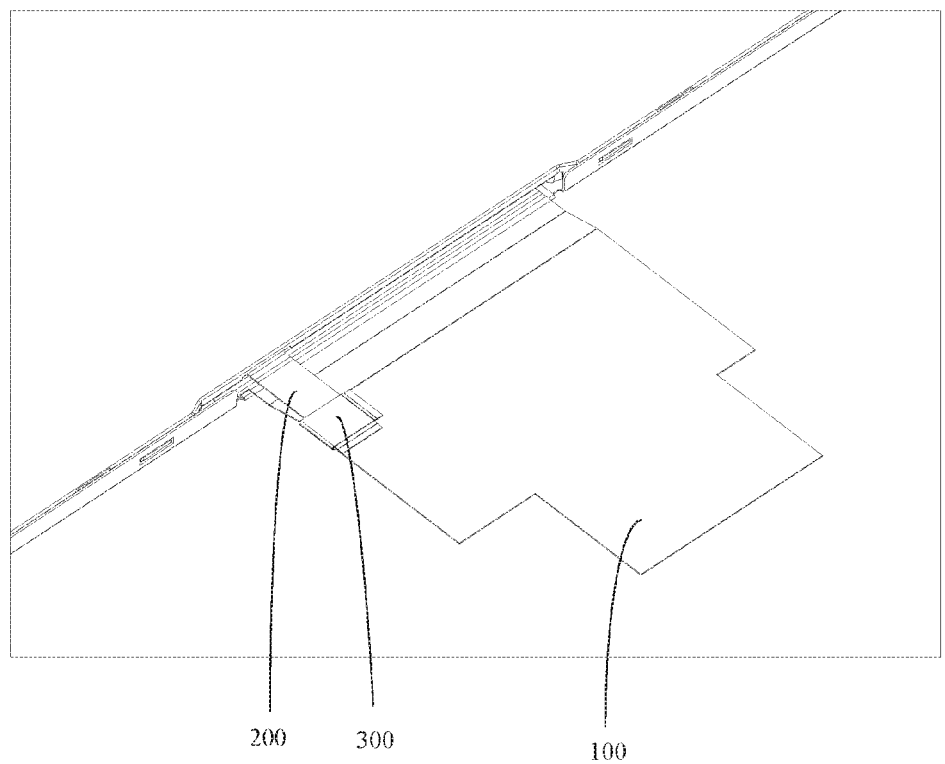
FIG. 6 is a schematic view showing a circuit board device in a first state according to some embodiments of the present disclosure.

In some embodiments of the present disclosure, as shown in FIGS. 6 and 7, the first portion 301 and the second portion 302 may each be an adhesive sheet having an adhesive force. In the first state, the first portion 301 and the second portion 302 are adhered onto the first circuit board 100 and the second circuit board 200 respectively, and the first portion 301 is connected to the second portion 302 in a tensioning manner, so as to press the first circuit board 100 against the second circuit board 200. In the second state, the first portion 301 is removed from the first circuit board 100 and/or the second portion 302 is removed from the second circuit board 200, so as to separate the first circuit board 100 from the second circuit board 200.

In the embodiments of the present disclosure, the first portion 301 may be adhered onto the first circuit board 100, the second portion 302 may be adhered onto the second circuit board 200, and the first portion 301 may be connected to the second portion 302 in a tensioning manner, so as to fix the first circuit board 100 and the second circuit board 200 between the first portion 301 and the second portion 302. In the case that the first circuit board 100 is to be separated from the second circuit board 200, the first portion 301 may be removed from the first circuit board 100 or the second portion 302 may be removed from the second circuit board 200.

As shown in FIGS. 6 and 7, optionally according an embodiment, the connector 300 is an adhesive tape, and the first portion 301 and the second portion 302 are connected to each other to form an integral structure. In this way, it is able to reduce the production cost, and facilitate the operation and the reworking process.

It should be appreciated that, in some other embodiments of the present disclosure, the first portion 301 and the second portion 302 may be any other adhesive sheets.

In addition, it should be appreciated that, in the case that the adhesive tape is adopted as the connector 300, low structural strength may be provided as compared with the other structures mentioned above. Hence, in order to prevent the occurrence of imperfect contact between the first predetermined connection section of the first circuit board 100 and the second predetermined connection section of the second circuit board 200, the conductive sheet 400 needs to be arranged between the first predetermined connection section and the second predetermined connection section.

It should be further appreciated that, in the case that the adhesive tape is adopted as the connector 300, the protrusions 303 on the first portion 301 and/or the second portion 302 may be formed during the formation of the adhesive tape.

In addition, it should be further appreciated that, the connector 300 may be of any other structures, e.g., it may be a combination of a metallic elastic sheet clip and an adhesive tape.

The present disclosure further provides in some embodiments a display apparatus, which includes a display panel, a backlight module and the above-mentioned circuit board device. The first circuit board 100 in the circuit board device is a flexible circuit board or printed circuit board on the display panel, and the second circuit board 200 in the circuit board device is a flexible circuit board for an LED light strip of the backlight module. Obviously, the display apparatus may also have the above-mentioned beneficial effects of the circuit board device.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A circuit board device, comprising:
    a first circuit board having a first predetermined connection section;
    a second circuit board arranged opposite to the first circuit board and having a second predetermined connection section directly facing the first predetermined connection section; and
    a connector comprising a first portion and a second portion, wherein
    the connector has:
    a first state where the first portion is arranged at a side of the first circuit board away from the second circuit board, the second portion is arranged at a side of the second circuit board away from the first circuit board, and the first portion and the second portion cooperate with each other to press the first circuit board against the second circuit board, the first predetermined connection section abuts against the second predetermined connection section, and the first circuit board is electrically connected to the second circuit board; and
    a second state where the first circuit board is separated from the second circuit board, the first predetermined connection section is separated from the second predetermined connection section, and the first circuit board is electrically disconnected from the second circuit board;
    wherein each of the first portion and the second portion is an adhesive sheet having an adhesive force;
    in the first state, the first portion and the second portion are adhered onto the first circuit board and the second circuit board respectively, the first portion and the second portion are connected in a tensioning manner and press the first circuit board against the second circuit board; and
    in the second state, the first portion is removed from the first circuit board and/or the second portion is removed from the second circuit board, and the first circuit board is separated from the second circuit board, and wherein the connector is an adhesive tape.

2. The circuit board device according to claim 1, wherein the first circuit board is provided with a plurality of first alignment holes, the second circuit board is provided with a plurality of second alignment holes at positions corresponding to the plurality of first alignment holes, and the first portion and/or the second portion are provided with protrusions which are fitted into the first alignment holes and the second alignment holes in the first state.

3. The circuit board device according to claim 2, wherein a number of the first alignment holes is three, the three first alignment holes are arranged as vertexes of a triangle, and the second alignment holes and the protrusions are arranged at positions corresponding to the three first alignment holes.

4. The circuit board device according to claim 2, wherein the protrusions are arranged on the first portion or the second portion and are fitted into the first alignment holes and the second alignment holes in the first state.

5. The circuit board device according to claim 2, wherein the protrusions are arranged on both the first portion and the second portion, in the first state, the protrusions on the first portion are fitted into the first alignment holes in the first circuit board, and the protrusions on the second portion are fitted into the second alignment holes in the second circuit board.

6. The circuit board device according to claim 1, wherein the connector is a clip-like structure;
the first portion is connected to one side of the second portion;
the first portion and the second portion are rotatable about a connection position to move close to each other, so as to be in the first state, and the first circuit board is pressed against the second circuit board through a clamp force caused by the first portion and the second portion; and
the first portion and the second portion are rotatable about the connection position to move away from each other, so as to be in the second state, the clamp force caused by the first portion and the second portion is released and the first circuit board is separated from the second circuit board.

7. The circuit board device according to claim 6, wherein the connector is an elastic sheet clip, and the first portion and the second portion are connected to each other to form an integral structure.

8. The circuit board device according to claim 7, wherein the connector is a metallic elastic sheet clip.

9. The circuit board device according to claim 1, wherein the first predetermined connection section is a first predetermined connecting finger comprising a plurality of first terminals;
the second predetermined connection section is a second predetermined connecting finger comprising a plurality of second terminals at positions corresponding to the plurality of first terminals; and
a conductive sheet is arranged between the first predetermined connection section and the second predetermined connection section, wherein the conductive sheet has a shape fit to the first predetermined connection section and the second predetermined connection section, so as to electrically connect the first terminals of the first predetermined connection section to the corresponding second terminals of the second predetermined connection section.

10. The circuit board device according to claim 9, wherein the conductive sheet is a conductive, double-sided adhesive tape.

11. The circuit board device according to claim 10, wherein the conductive sheet is an anisotropic conductive, double-sided adhesive tape which is conductive in a longitudinal direction and nonconductive in a horizontal direction.

12. A display apparatus, comprising a circuit board device, wherein the circuit board device comprises:
a first circuit board having a first predetermined connection section;
a second circuit board arranged opposite to the first circuit board and having a second predetermined connection section directly facing the first predetermined connection section; and
a connector comprising a first portion and a second portion, wherein the connector has:
a first state where the first portion is arranged at a side of the first circuit board away from the second circuit board, the second portion is arranged at a side of the second circuit board away from the first circuit board, and the first portion and the second portion cooperate with each other to press the first circuit board against the second circuit board, the first predetermined connection section abuts against the second predetermined connection section, and the first circuit board is electrically connected to the second circuit board; and
a second state where the first circuit board is separated from the second circuit board, the first predetermined connection section is separated from the second predetermined connection section, and the first circuit board is electrically disconnected from the second circuit board;
wherein the first circuit board is a flexible circuit board or printed circuit board on a display panel of the display apparatus, and the second circuit board is a flexible circuit board for an organic light-emitting diode light strip of a backlight module of the display apparatus; and
wherein each of the first portion and the second portion is an adhesive sheet having an adhesive force;
In the first state, the first portion and the second portion are adhered onto the first circuit board and the second circuit board respectively, the first portion and the second portion are connected in a tensioning manner and press the first circuit board against the second circuit board; and
in the second state, the first portion is removed from the first circuit board and/or the second portion is removed from the second circuit board, and the first circuit board is separated from the second circuit board.

13. The display apparatus according to claim 12, wherein the connector is a clip-like structure;
the first portion is connected to one side of the second portion;
the first portion and the second portion are rotatable about a connection position to move close to each other, so as to be in the first state, and the first circuit board is pressed against the second circuit board through a clamp force caused by the first portion and the second portion; and
the first portion and the second portion are rotatable about the connection position to move away from each other, so as to be in the second state, the clamp force caused by the first portion and the second portion is released and the first circuit board is separated from the second circuit board.

14. The display apparatus according to claim 12, wherein the first predetermined connection section is a first predetermined connecting finger comprising a plurality of first terminals;
the second predetermined connection section is a second predetermined connecting finger comprising a plurality of second terminals at positions corresponding to the plurality of first terminals; and
a conductive sheet is arranged between the first predetermined connection section and the second predetermined connection section, wherein the conductive sheet has a shape fit to the first predetermined connection section and the second predetermined connection section, so as to electrically connect the first terminals of the first predetermined connection section to the corresponding second terminals of the second predetermined connection section.

15. The display apparatus according to claim 12, wherein the first circuit board is provided with a plurality of first alignment holes, the second circuit board is provided with a plurality of second alignment holes at positions corresponding to the plurality of first alignment holes, and the first portion and/or the second portion are provided with protrusions which are fitted into the first alignment holes and the second alignment holes in the first state.

16. The display apparatus according to claim 15, wherein the protrusions are arranged on the first portion or the second portion and are fitted into the first alignment holes and the second alignment holes in the first state.

17. The display apparatus according to claim 15, wherein the protrusions are arranged on both the first portion and the second portion, in the first state, the protrusions on the first portion are fitted into the first alignment holes in the first circuit board, and the protrusions on the second portion are fitted into the second alignment holes in the second circuit board.

* * * * *